United States Patent [19]

Igarashi

[11] 4,321,562
[45] Mar. 23, 1982

[54] CRYSTAL OSCILLATOR CIRCUIT CAPABLE OF CHANGING THE NUMBER OF INVERTER STAGES COUPLED IN SERIES

[75] Inventor: Hatsuhide Igarashi, Tokyo, Japan

[73] Assignee: Nippon Electric Co., Ltd., Tokyo, Japan

[21] Appl. No.: 110,715

[22] Filed: Jan. 9, 1980

[30] Foreign Application Priority Data

Jan. 11, 1979 [JP] Japan .................................. 54/3247
Jun. 6, 1979 [JP] Japan ................................ 54/70982

[51] Int. Cl.³ ............................................. H03B 5/36
[52] U.S. Cl. .............................. 331/116 FE; 331/158; 368/159
[58] Field of Search .............. 331/116R, 116 FE, 158, 331/159; 368/156, 159, 167

[56] References Cited

U.S. PATENT DOCUMENTS 3,676,801 7/1972 Musa ........................... 331/116 FE
4,039,973 8/1977 Yamashiro ...................... 331/158 X
4,218,661 8/1980 Imamura ...................... 331/116 FE

*Primary Examiner*—Siegfried H. Grimm
*Attorney, Agent, or Firm*—Sughrue, Mion, Zinn, Macpeak and Seas

[57] ABSTRACT

A single-stage inverter forming a closed loop together with a crystal resonator fails to provide sufficient gain and hence, power consumption becomes high during stable oscillation. If inverters are coupled together in a three-stage cascade-connection, on the other hand, the gain becomes excessively high and undesired high frequency oscillation takes place at the start of oscillation. This invention provides a crystal oscillator circuit which, in order to solve these problems, uses a single-stage inverter to form a closed loop with a crystal resonator at the start of oscillation and uses three-stage inverters cascade-connected with each other during stable oscillation.

11 Claims, 6 Drawing Figures

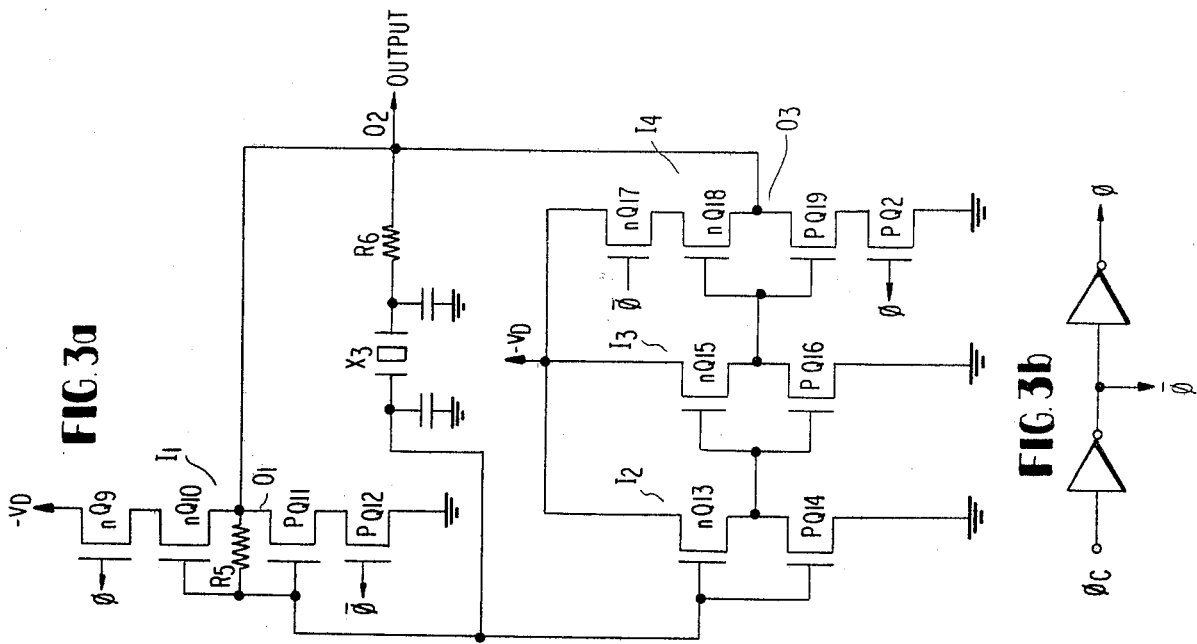
FIG. 3a
FIG. 3b
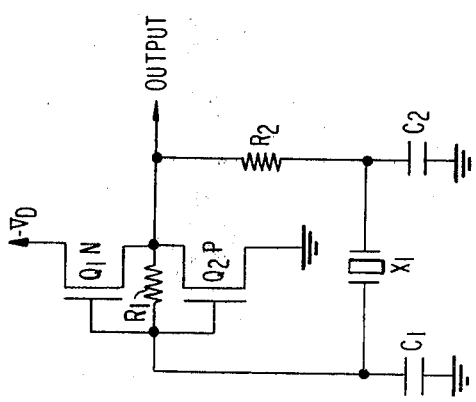
FIG. 1
(PRIOR ART)
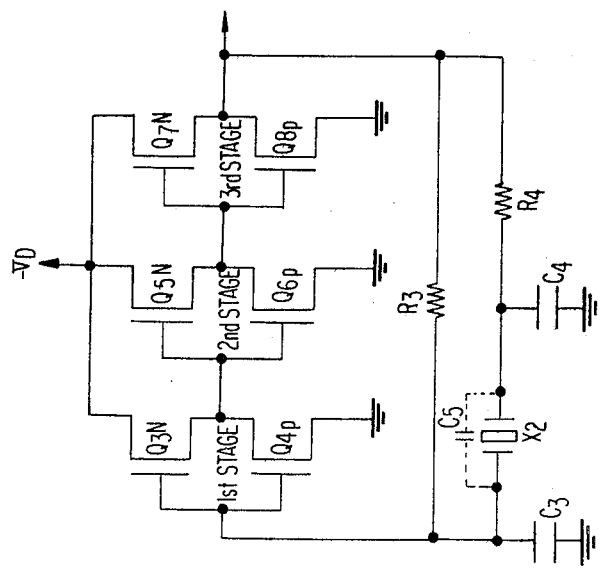
FIG. 2
(PRIOR ART)

CRYSTAL OSCILLATOR CIRCUIT CAPABLE OF CHANGING THE NUMBER OF INVERTER STAGES COUPLED IN SERIES

BACKGROUND OF THE INVENTION

1. Field of the Invention

This invention relates to an oscillator circuit using a piezoelectric resonator and more particularly to an oscillator circuit using a crystal and metal oxide semiconductor field effect transistors (hereinafter referred to as MOS FET).

2. Description of the Prior Art

As an integrated circuit used in an electronic timepiece or the like for which low power consumption is required, there has conventionally been used a complementary field effect transistor (hereinafter referred to as a C-MOS FET) circuit which comprises principally a series connection of a p-channel MOS FET and an n-channel MOS FET. A piezoelectric resonator such as a crystal resonator has also gained wide application to oscillator circuits because it enables the oscillation frequency to be accurately determined.

A conventional oscillator using these C-MOS FET circuits and a piezoelectric resonator generally has a closed circuit formed by a single-stage C-MOS inverter and a crystal resonator as illustrated in FIG. 1. In this case, the output waveform does not assume a perfectly rectangular shape because the gain of the inverter is not large enough. Consequently, the current flowing through the inverter becomes large and power consumption becomes high. It is therefore impossible to operate the circuit at a low rate of power consumption.

To minimize the power consumption, it is also known to use three-stage C-MOS inverters connected in a cascade connection instead of the single-stage C-MOS inverter thereby to separate the amplification stage from the output stage. In this case, since a sufficient gain can be obtained, the output waveform assumes a perfectly rectangular shape and the power consumption becomes low during the stable oscillation. In more detail, the current flowing through the final inverter stage as an output stage is minimized by the rectangular shape output. However, due to the high gain, there tends to be formed a CR oscillation circuit in which the crystal resonator operates as a capacitor $C_5$ in a feed-back loop. This circuit causes CR oscillation at a frequency deviated considerably from a predetermined resonance frequency when the operating voltage rises abruptly, especially during the transient period such as at start of oscillation. This abnormal oscillation often occurs at a frequency considerably higher than the oscillation frequency of the crystal resonator. For this reason, it has been impossible to obtain stable oscillation at the start of oscillation.

SUMMARY OF THE INVENTION

It is therefore a principal object of the present invention to obtain an oscillator circuit using a piezoelectric resonator which starts oscillating at a predetermined frequency from the start of oscillation and has low power consumption during stable oscillation.

In accordance with the present invention, there is provided an oscillation circuit in which a closed loop is formed by a piezoelectric resonator and an inverter amplifier using a C-MOS FET circuit, and the inverter amplifier is selectively changed over to a single-stage inverter and to plural, odd-numbered stages of inverters coupled in a cascade-connection in accordance with control signals. The switching between the single-stage inverter and the odd-numbered stages of inverters is such that it is made to the single-stage inverter at the start of oscillation and to the odd-numbered stages of inverters during stable oscillation.

Accordingly, at the start of oscillation, the circuit uses the single-stage inverter so that there is no CR oscillation arising from excessively high gain. Hence, the circuit starts oscillating at a frequency determined by the piezoelectric resonator from the start of oscillation. During stable oscillation, the circuit is switched to the odd-numbered stages of inverters, the output waveform assumes a perfectly rectangular shape and the power consumption becomes low. Reduction of the power consumption can be further enhanced by enlarging the operating impedance of the MOS FETs forming the C-MOS inverter at the pre-stage while decreasing the operating impedance of MOS FETs forming the inverter at the output stage.

BRIEF DESCRIPTION OF THE DRAWINGS

FIGS. 1 and 2 are circuit diagrams each showing the conventional C-MOS crystal oscillator circuits;

FIG. 3a is a circuit diagram showing a first embodiment of the present invention and FIG. 3b is a block diagram of a control signal generation circuit used for controlling the first embodiment of the present invention;

DESCRIPTION OF THE PREFERRED EMBODIMENTS

Figure 4:
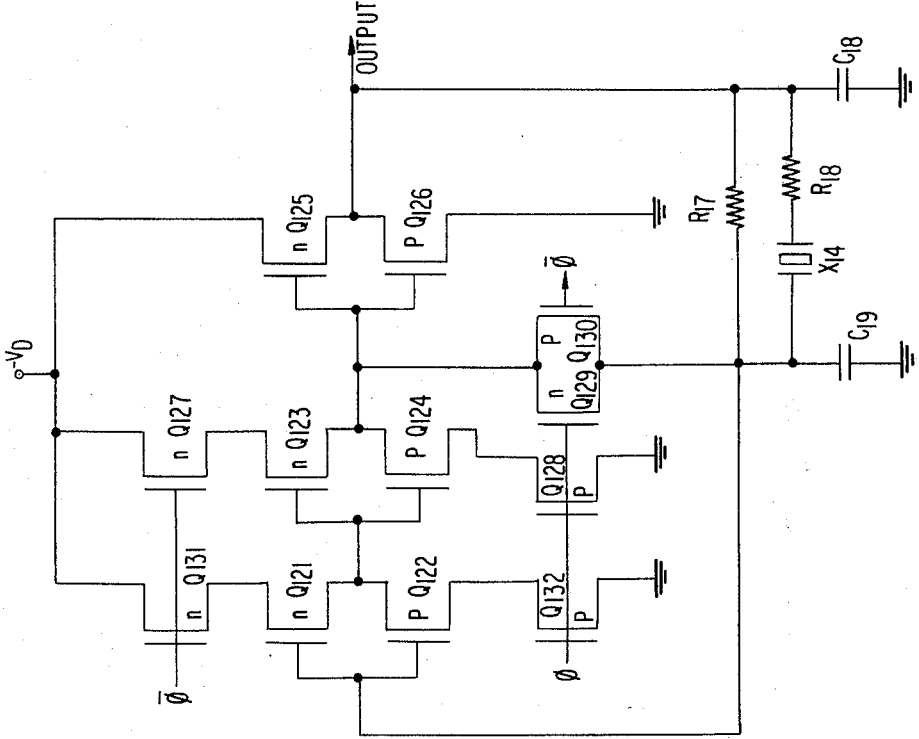
FIG. 4 is a circuit diagram showing a second embodiment of the present invention.

Referring initially to FIG. 1, in the conventional crystal oscillation circuit using the C-MOS FET circuit, both ends of a crystal resonator $X_1$ are grounded via capacitors $C_1$ and $C_2$, respectively. The C-MOS FET circuit consists of an N-channel MOS FET (hereinafter referred to as N-MOS FET) $Q_1$, a P-channel MOS FET (hereinafter referred to as P-MOS FET) $Q_2$ and a resistor $R_1$. The input end of this C-MOS FET circuit is connected electrically to the junction between the capacitor $C_1$ and the crystal resonator $X_1$ while its output end is connected electrically to the junction between the capacitor $C_2$ and the crystal resonator $X_1$ via a resistor $R_2$. A power source voltage $-V_D$ is impressed upon the source of the N-MOS FET $Q_1$ and the output is taken out from the junction between the C-MOS FET circuit and the resistor $R_2$.

In such a circuit, sufficient gain can not be obtained as the inverter of C-MOS FET is used in a single stage. Though this circuit is advantageous in that the oscillation frequency is determined by the crystal resonator $X_1$ itself from the start of oscillation, the output waveform does not have a perfectly rectangular shape. When the output waveform is not of a rectangular shape, both the N-MOS FET $Q_1$ and the P-MOS FET $Q_2$ are not brought into saturate state at the same time, and neither the N-MOS FET $Q_1$ nor the P-MOS FET $Q_2$ is brought into the perfectly non-conductive state. Consequently, a flow-through current constantly flows through the series connection of P- and N-MOS FETs so that the power consumption increases.

On the other hand, the crystal oscillator shown in FIG. 2 has a three-stage cascade connection inverter instead of the single stage inverter of FIG. 1. N-MOS FET $Q_3$ and P-MOS FET $Q_4$ form a first stage, N-MOS FET $Q_5$ and P-MOS FET $Q_6$, a second stage, and N-MOS FET $Q_7$ and P-MOS FET $Q_8$, a third stage. A power $-V_D$ is supplied to sources of N-MOS FETs $Q_3$, $Q_5$ and $Q_7$, and sources of P-MOS FETs $Q_4$, $Q_6$, $Q_8$ are grounded. Output of the first stage at the drains of N- and P-MOS FETs $Q_3$ and $Q_4$ is connected to the input of the second stage at the gates N- and P-MOS FETs $Q_5$ and $Q_6$. Similarly, the output of the second stage is connected to the input of the third stage. The output of the third stage is derived as an output of the oscillator circuit, and is fed back to input of the first stage through a resistor $R_3$ and a feed-back circuit. The feed-back circuit comprises a crystal resonator $X_2$, a resistor $R_4$, and capacitors $C_3$ and $C_4$.

According to the oscillator circuit using a three-stage cascade connection inverter shown in FIG. 2, the gain is sufficiently high so that the output has a perfectly rectangular shape, and the low power consumption operation, which is an essential feature of the C-MOS FET circuit, can be accomplished. Since the gain is too high, however, the crystal resonator $X_2$ functions as a capacitor $C_5$ which forms a CR oscillation circuit when a power $-V_D$ is applied. For this reason, the frequency at the start of oscillation sometimes becomes higher than the frequency which is inherent to the crystal resonator $X_2$. If such oscillation is applied to an electronic circuit using the oscillation signal of the oscillator circuit, the electronic circuit does not achieve the predetermined operation.

According to the first embodiment of the present invention shown in FIG. 3a, the inverter $I_1$ is formed by connecting in series N-MOS FETs $Q_9$, $Q_{10}$ and P-MOS FETs $Q_{11}$, $Q_{12}$ between the power source $-V_D$ and ground. The output $O_1$ of this inverter $I_1$ is taken from the intermediate junction between the transistors $Q_{10}$ and $Q_{11}$ and is led to the output point $O_2$ of the oscillator circuit. The output signal at the output point $O_2$ is positively fed back to the gates of the MOS FETs $Q_{10}$ and $Q_{11}$ via a resistor $R_6$ and a crystal resonator $X_3$. Inverters $I_2$, $I_3$, and $I_4$ are cascade-connected with each other whereby the input of the first stage inverter $I_2$ is a positive feed-back input from the output point $O_2$ via the resistor $R_6$ and the crystal resonator $X_3$ in the same way as that of the inverter $I_1$. The output $O_3$ of the inverter $I_4$ is connected to the output point $O_2$. The inverter $I_2$ consists of N-MOS FET $Q_{13}$ and P-MOS FET $Q_{14}$ connected in series, and the inverter $I_3$, N-MOS FET $Q_{15}$ and P-MOS FET $Q_{16}$ connected in series. The inverter $I_4$ comprises four transistors, N-MOS FETs $Q_{17}$ and $Q_{18}$ and P-MOS FETs $Q_{19}$ and $Q_{20}$, connected in series.

In the inverter $I_1$, a control signal $\phi$ is applied to the gate of the N-MOS FET $Q_9$ while a control signal $\bar{\phi}$ having a phase opposite to the control signal $\phi$ is applied to the P-MOS FET $Q_{12}$. Hence, the transistors $Q_9$, $Q_{12}$ function as switches in accordance with the control signals $\phi$ and $\bar{\phi}$ so that the inverter $I_1$ becomes operative when both transistors $Q_9$, $Q_{12}$ become conductive. Similarly, in the inverter $I_4$, a control signal $\bar{\phi}$ is applied to the gate of the N-MOS FET $Q_{17}$ while a control signal $\phi$ is applied to the P-MOS FET $Q_{20}$, and then the transistors $Q_{17}$, $Q_{20}$ function as switches and control the operation of the inverter $I_4$. The operating periods of the inverters $I_1$ and $I_4$ are complemental to each other.

The control signals $\bar{\phi}$ and $\phi$ are obtained by passing a signal $\phi_c$ through a single stage inverter and a two-stage inverter as schematically depicted in FIG. 3b, respectively.

In the initial condition, the control signal $\phi$ is assumed to be at a high level and the control signal $\bar{\phi}$ is assumed to be at a low level. Under this state, FETs $Q_9$ and $Q_{12}$ are conductive and FETs $Q_{17}$ and $Q_{20}$ are non-conductive so that oscillation is effected by the inverter $I_1$ as a single-stage inverter type. After a while, when all the circuit elements become operative in a steady state, a low level signal is fed to the input of the control signal generator shown in FIG. 3b as the control pulse $\phi_c$ whereby the levels of the control signals $\phi$ and $\bar{\phi}$ are reversed, thereby turning FETs $Q_9$ and $Q_{12}$ non-conductive and turning FETs $Q_{17}$ and $Q_{20}$ conductive. Hence, the oscillator circuit continues to oscillate by the cascade connected three-stage inverters $I_2$, $I_3$ and $I_4$.

In this circuit, the inverter $I_1$ may use transistors having sufficiently large gm as FETs $Q_{10}$ and $Q_{11}$ for the stable starting of oscillation. Though power consumption is large at the start of oscillation, it does not pose a problem because the oscillation is thereafter switched to the oscillation by means of the three-stage inverters $I_2$, $I_3$ and $I_4$. After being switched, the oscillator circuit using the three-stage inverters $I_2$, $I_3$ and $I_4$ derives a rectangular wave output and consumes low power. In this way, this crystal oscillator circuit has the advantages of the oscillator circuits using the single-stage inverter $I_1$ and, the three-stage inverters $I_2$, $I_3$ and $I_4$. That is, the start of oscillation is stable and the power consumption is low.

As a method for obtaining the control pulse $\phi_c$ in this instance, mention can be made of a method which comprises the steps of detecting the rise of the power voltage, counting a predetermined time duration by a counter, and outputting a control signal $\phi_c$. Alternatively, it is possible to use a time constant circuit or a delay circuit which starts operating at the rise of the power voltage.

In accordance with the circuit of the present invention described above, it is possible to extract only the advantages of the oscillator circuit of single-stage inverter type and three-stage inverter type by changing the number of inverters alternately. As a result, it becomes possible to realize a crystal oscillator circuit having a stable starting oscillation and low power consumption.

Next, a second embodiment of the present invention will be explained with reference to FIG. 4.

Though the above-mentioned embodiment includes four inverters, this second embodiment uses only three inverters $I_{11}$, $I_{12}$ and $I_{13}$ for obtaining both the single-stage type and three-stage type oscillator circuits. The output $N_1$ of the inverter $I_{11}$ of the first stage, which comprises N-MOS FET $Q_{23}$ and P-MOS FET $Q_{14}$, is led to the output OUT via a control gate of N-MOS FET $Q_{34}$ and P-MOS FET $Q_{35}$ to which the control signals $\phi$ and $\bar{\phi}$ are applied, respectively, and via a node $N_2$. The output $N_1$ is also applied as an input to the second stage inverter $I_{12}$, which comprises N-MOS FET $Q_{25}$ and P-MOS FET $Q_{26}$, via a control gate of N-MOS FET $Q_{30}$ and P-MOS FET $Q_{31}$ to whose gates the control signals $\phi$ and $\bar{\phi}$ are also applied, respectively. The output of the inverter $I_{12}$ is directly fed to the input of the inverter $I_{13}$ of N-MOS FET $Q_{18}$ and P-MOS FET $Q_{19}$ while the output of the inverter $I_{13}$ is led to the output OUT via a control gate of N-MOS FET $Q_{32}$ and P-MOS FET $Q_{33}$ to whose gates the control signals $\phi$ and $\bar{\phi}$ are also applied, respectively, and via the node $N_2$. A resistor $R_{13}$ and a feed-back circuit is coupled between the input of the inverter $I_{11}$ and the node $N_2$. The feed-back circuit comprises a resistor $R_{16}$, a crystal resonator $X_4$ and capacitors $C_{15}$ and $C_{16}$.

The control signals $\phi$ and $\bar{\phi}$ in this instance are the same as those in the embodiment shown in FIGS. 3a and 3b. At the start of oscillation, the control signal $\phi$ is at a high level and the control signal $\bar{\phi}$ is at a low level. Consequently, while the transistors $Q_{34}$ and $Q_{35}$ are conductive, the transistors $Q_{30}$–$Q_{33}$ being kept non-conductive. Hence, the oscillator circuit operates by the use of the first stage inverter $I_{11}$ only. When the steady state is attained, the control signal $\phi$ becomes low and the control signal $\bar{\phi}$ becomes high whereby the transistors $Q_{30}$–$Q_{33}$ become conductive and the transistors $Q_{34}$ and $Q_{35}$ become non-conductive. Therefore, the inverters $I_{11}$–$I_{13}$ are brought into the cascade connection with one another to form an oscillator circuit using three-stage inverters.

Incidentally, it is preferable for a smooth change between the oscillator circuits using the single inverter and the third-stage inverter to provide a period in which all transistors $Q_{30}$–$Q_{35}$ become conductive during the switching period.

In this manner, it can be appreciated that the circuit of this embodiment functions in the same way as the aforementioned first embodiment.

Figure 5:
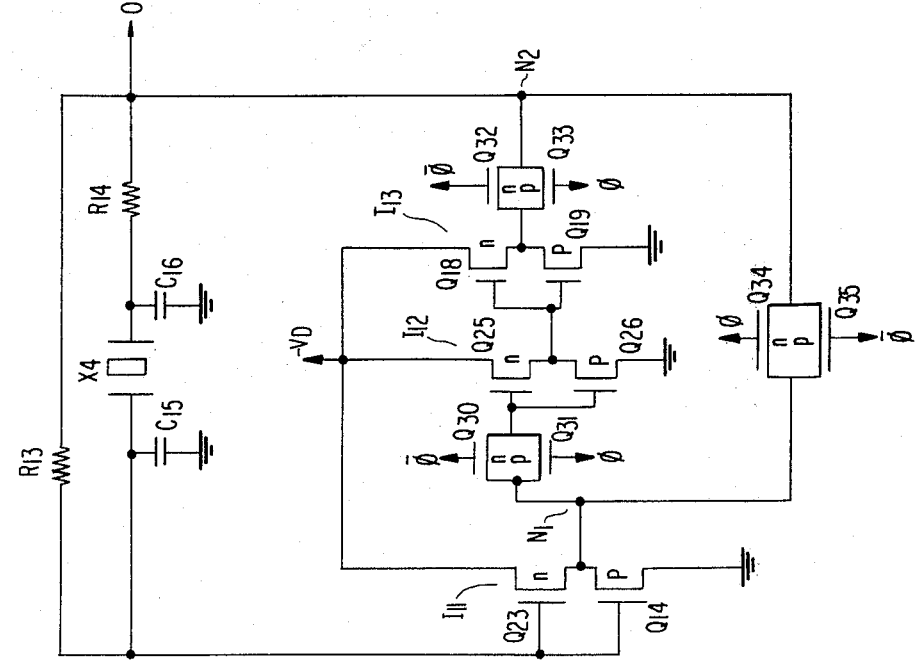
FIG. 5 is a circuit diagram showing a third embodiment of the present invention.

Referring now to FIG. 5, a crystal oscillator circuit of the third embodiment includes a first inverter consisting of N-MOS FETs $Q_{131}$, $Q_{121}$ and P-MOS FETs $Q_{122}$, $Q_{132}$ connected in series with each other; a second inverter consisting of N-MOS FETs $Q_{127}$, $Q_{123}$ and P-MOS FETs $Q_{124}$, $Q_{128}$ connected in series with each other; a third inverter circuit consisting of N-MOS FET $Q_{125}$ and P-MOS FET $Q_{126}$; resistors $R_{17}$ and $R_{18}$; a crystal resonator $X_{14}$; and capacitors $C_{18}$ and $C_{19}$. The drain output of the first inverter is connected to the input gate of the second inverter; the drain output of the second inverter is connected to the gate input of the third inverter, and input and output ends of the crystal resonator $X_{14}$, having both ends thereof grounded via capacitors $C_{18}$, $C_{19}$, respectively, are interposed between the gate input of the first inverter and the drain output of the third inverter. A resistor $R_{18}$ is connected to one side of the crystal resonator $X_{14}$ and a resistor $R_{17}$ is connected in parallel with the crystal resonator $X_{14}$. A control signal $\bar{\phi}$ is applied to the gates of N-MOS FET $Q_{131}$ of the first inverter and N-MOS FET $Q_{127}$ of the second inverter while an inverted control signal $\phi$ is applied to the gates of P-MOS FET $Q_{132}$ and P-MOS FET $Q_{128}$ of the first and second inverters. Further, the junction between the output of the second inverter and the input of the third inverter is bypassed to input of the first inverter via a gate circuit (voltage switching circuit) consisting of the N-MOS FET $Q_{129}$ and P-MOS FET $Q_{130}$ connected in parallel and functioning as a switching circuit. The control signal $\phi$ is applied to the gate of N-MOS FET $Q_{129}$ and the control signal $\bar{\phi}$, to P-MOS FET $Q_{130}$.

According to such an oscillation circuit, at the beginning, the control signal $\phi$ is at a high level and the control signal $\bar{\phi}$ is at a low level. Under this state, the gate circuit ($Q_{129}$, $Q_{130}$) is conductive and the first and second inverters are cut off from the oscillation circuit so that the oscillation is commenced only by the third inverter ($Q_{125}$, $Q_{126}$). After a while, when the internal circuit and the voltage of the power source become steady, the control signals $\phi$ and $\bar{\phi}$ are reversed whereby the gate circuits ($Q_{129}$, $Q_{130}$) are cut off and the first and second inverters then belong to the oscillation circuit to form a three-stage inverter. Thus, the steady-state oscillation is achieved by the three-stage inverter.

In this circuit, the power consumption becomes small because the three-stage inverter type is employed at the steady state oscillation. At the start of oscillation, no current flows through the first and second inverters due to non-conducting state of the FETs $Q_{127}$, $Q_{128}$, $Q_{131}$ and $Q_{132}$. Thus even at the start of oscillation, power consumption is minimized. Similar to the above embodiments, the frequency at the start of oscillation is stable and fixed to the coherent frequency of the crystal resonator $X_{14}$. The control pulse may be generated by detecting the rise of the power voltage and forming high and low level control signals $\phi$ and $\bar{\phi}$ or by detecting the steady-state oscillation from the output signal derived from the output terminal and forming the control signals $\phi$ and $\bar{\phi}$, or by counting the time after the start of operation by the counter and forming the control signals $\phi$ and $\bar{\phi}$. Such generation of the control signals $\phi$ and $\bar{\phi}$ is extremely easy. As a modification, the sources of the transistors $Q_{121}$, $Q_{122}$ or the transistors $Q_{123}$, $Q_{124}$ may be connected directly to the power source and ground and the transistors $Q_{131}$, $Q_{132}$, and/or $Q_{127}$, $Q_{128}$ are omitted.

As described in the foregoing, the present invention provides oscillator circuits changeable between the single-stage inverter type oscillator and the three-stage inverter type oscillator by the control signals so that there can be provided an oscillator circuit which has low power consumption and can exhibit the stable start of oscillation and maintain stable oscillation.

Incidentally, besides the crystal resonator, a resonator employing a piezoelectric material other than crystal may be used in the present invention. Likewise either one of N-MOS FET and P-MOS FET may be used to form a transfer gate instead of the C-MOS gate circuit employed in the above embodiments. Further, though the oscillator circuit operates by the three-stage inverter circuit as the steady-state oscillating condition in the above embodiments, the number of inverter stages can be arbitrary selected to be odd-numbers such as five, seven or more.

What is claimed is:

1. An oscillator circuit comprising:
   a piezoelectric resonator;
   an inverter amplifier having an input portion to which one end of said piezoelectric resonator is coupled and an output portion to which the other end of said piezoelectric resonator is coupled; and
   an output terminal coupled to the output portion of said inverter amplifier;
   said input portion and said output portion of said inverter amplifier being coupled to a single-stage inverter at the start of oscillation and to plural, odd-numbered stages of inverters cascade-connected with each other substantially after the start of oscillation.

2. The oscillator circuit as defined in claim 1 wherein said inverter amplifier includes a first inverter portion consisting of a single-stage inverter and a second inverter portion consisting of plural, odd-numbered stages of inverters, and said first and second inverter portions are selectively coupled to said input portion and said output portion in accordance with control signals.

3. The oscillator circuit as defined in claim 1 wherein said inverter amplifier includes plural, odd-numbered stages of inverters cascade-connected with each other and means for coupling only one of said plural inverters to said input portion and said output portion in accordance with control signals.

4. The oscillator circuit as defined in claim 2, wherein said control signals operate to render said first inverter portion conductive at the start of operation, and non-conductive substantially after the start of operation.

5. The oscillator circuit as defined in claim 4, wherein said control signals operate to render said second inverter portion non-conductive at the start of operation, and conductive substantially after the start of operation.

6. The oscillator circuit as defined in claim 1, wherein the output of said output portion is positively fed back to said input portion via a resistor and said piezoelectric resonator.

7. The oscillator circuit as defined in claim 3, wherein said coupling means comprises a switching means operable in response to said control signals, whereby the output of said one inverter is coupled to said output portion at the start of operation, and to the input of a second inverter substantially after the start of operation.

8. The oscillator circuit as defined in claim 7, wherein said second inverter is the second of said odd numbered stages of cascade connected inverters and said one inverter is the first of such inverters.

9. The oscillator circuit as defined in claim 3, wherein said coupling means comprises a switching means operable in response to said control signals, whereby the output of said one inverter is coupled to said output portion; and the input of said one inverter is coupled to said output portion via said piezoelectric resonator at the start of operation, and to the output of a second inverter substantially after the start of operation.

10. The oscillator circuit as defined in claim 9, wherein said one inverter is the last of said odd numbered stages of cascade connected inverters, and said second inverter is the next to last of said inverters.

11. An oscillator circuit comprising:
a piezoelectric resonator
an inverter amplifier having an input portion to which one end of said piezoelectric resonator is coupled and an output portion to which the other end of said piezoelectric resonator is coupled; and
an output terminal coupled to the output portion of said inverter amplifier, wherein said inverter amplifier includes:
a single-stage inverter;
plural odd-numbered stages of inverters cascade connected with each other; and
means for selectively coupling to said input and output portion of said inverter amplifier (a) said single-stage inverter at the start of oscillation and (b) said plural, odd-numbered stages of inverters substantially after the start of oscillation.

* * * * *

UNITED STATES PATENT AND TRADEMARK OFFICE
CERTIFICATE OF CORRECTION

PATENT NO. : 4,321,562
DATED : March 23, 1982
INVENTOR(S) : Hatsuhide IGARASHI

It is certified that error appears in the above—identified patent and that said Letters Patent is hereby corrected as shown below:

Column 2, line 14, delete "from" and insert -- form -- .

Column 3, line 57, delete "$\phi$" and insert -- $\bar{\phi}$ -- .

Column 4, line 64, delete "$\phi$" and insert -- $\bar{\phi}$ -- (first occurrence) .

Column 5, line 2, delete "$\phi$" and insert -- $\bar{\phi}$ -- (first occurrence) ;

line 7, delete "$\phi$" and insert -- $\bar{\phi}$ -- (second occurrence) ;

line 61, delete "$\phi$" and insert -- $\bar{\phi}$ -- .

Column 6, line 44, delete "as" and insert -- at -- .

Signed and Sealed this

Eighth Day of June 1982

[SEAL]

Attest:

GERALD J. MOSSINGHOFF

Attesting Officer      Commissioner of Patents and Trademarks